US00RE36427E

United States Patent [19]

Gioutsos

[11] E Patent Number: Re. 36,427

[45] Reissued Date of Patent: Dec. 7, 1999

[54] SYSTEM AND METHOD FOR CONTROLLING VEHICLE SAFETY DRIVE

[75] Inventor: Tony Gioutsos, Brighton, Mich.

[73] Assignee: Breed Automotive Technology, Inc., Lakeland, Fla.

[21] Appl. No.: 09/203,851

[22] Filed: Dec. 2, 1998

Related U.S. Patent Documents

Reissue of:

[64] Patent No.: 5,580,084
Issued: Dec. 3, 1996
Appl. No.: 08/527,159
Filed: Sep. 12, 1995

[51] Int. Cl.[6] ..... B60R 21/32

[52] U.S. Cl. ..... 280/735; 180/268; 180/274

[58] Field of Search ..... 280/735; 180/268, 180/274

[56] References Cited

U.S. PATENT DOCUMENTS

| | | | |
|---|---|---|---|
| 5,007,661 | 4/1991 | Lenzen | 280/735 |
| 5,119,901 | 6/1992 | Buie | 180/274 |
| 5,330,226 | 7/1994 | Gentry et al. | 280/735 |
| 5,335,749 | 8/1994 | Taguchi et al. | 180/274 |
| 5,350,189 | 9/1994 | Tsuchitani et al. | 280/728.1 |
| 5,364,158 | 11/1994 | Watanabe et al. | 296/189 |
| 5,369,305 | 11/1994 | Duhan et al. | 307/10.1 |
| 5,394,142 | 2/1995 | Dusart | 280/735 |
| 5,433,101 | 7/1995 | Spangler et al. | 280/735 |
| 5,441,301 | 8/1995 | Breed et al. | 280/735 |

FOREIGN PATENT DOCUMENTS 0 594 180 4/1994 European Pat. Off. .

*Primary Examiner*—Kenneth R. Rice
*Attorney, Agent, or Firm*—Markell Seitzman

[57] ABSTRACT

A system and method for controlling actuation of a vehicle safety device in response to an impact to a first portion of the vehicle includes a ferromagnetic element mechanically coupled with the first portion of the vehicle so as to receive elastic strain waves generated as a result of plastic deformation of the first portion of the vehicle. A permanent magnet is mounted on the vehicle adjacent to the ferromagnetic element so that the ferromagnetic element itself influences the magnetic field. An induction coil is also mounted on the vehicle so as to fall within the magnetic field generated by the magnet. Upon plastic deformation of the first portion of the vehicle, the ensuing elastic strain waves elastically deform the ferromagnetic element to vary its ferromagnetic properties and, in turn, alter the magnetic field so as to induce an electromotive force voltage in the induction coil. A signal processor receives the electromotive force voltage induced in the induction coil by the varying magnetic field. The signal processor actuates the safety device when the electromotive force voltage, or an appropriate measure derived from the electromotive force voltage, exceeds a predetermined threshold.

19 Claims, 1 Drawing Sheet

SYSTEM AND METHOD FOR CONTROLLING VEHICLE SAFETY DRIVE

Matter enclosed in heavy brackets [ ] appears in the original patent but forms no part of this reissue specification; matter printed in italics indicates the additions made by reissue.

TECHNICAL FIELD

The present invention relates to an improved system and method for controlling actuation of a vehicle safety device such as a vehicle air bag, and, particularly, for controlling actuation of a vehicle safety device in the event of a side-impact crash.

BACKGROUND OF THE INVENTION

The prior art has long searched for a control system for a vehicle safety device capable of discriminating between crash events requiring actuation of the safety device and transitory mechanical inputs in response to which actuation of the safety device would be either unwarranted, undesirable or even increasingly hazardous to either the vehicle or its occupants. Current systems typically employ inertia-based accelerometers, either electromechanical "ball-in-tube" sensors or piezoelectric accelerometers operating at a frequency well below 1 Khz, to provide the system with vehicle acceleration data from which crash discrimination "measures" are derived for ultimate comparison with one or more thresholds. And, in the context of front-impact crash discrimination, such inertia-based accelerometers have benefitted from the relatively long period—perhaps 30 msec or longer—within which to provide the necessary data for crash discrimination (either through the closing of a damped acceleration-responsive "switch" or in the form of a set of digital acceleration data from inertia-based piezoelectric accelerometers). Even so, current crash discrimination algorithms used in connection with data generated with inertia-based piezoelectric accelerometers typically assume an incomplete data set with which to decide whether to actuate the safety device.

In the context of side-impact crash discrimination, the prior art is faced with a particularly limited time frame within which to decide whether to actuate the safety device—perhaps as little as 5 msec. Such a short time frame is typically inadequate to close the mechanical contacts of an electromechanical acceleration sensor. The short time frame is also generally insufficient for inertia-based piezoelectric accelerometers to provide an adequate data set for crash discrimination, thereby greatly increasing the likelihood of improper actuation of the safety device. These small and incomplete data sets may further render such piezoelectric accelerometer-based systems vulnerable to excessive. EMI and "rough road" inputs to the vehicle.

Still further, such piezoelectric accelerometer-based systems must account for the effects of temperature and component aging on accelerometer output, e.g., the accelerometer's offset and sensitivity. The resulting requirement for frequent recalibration—and the correlative requirement for the complicated methods and apparatus used for such recalibration—become increasingly important to ensure proper system response when facing side-impact crashes, with their reduced discrimination window and correspondingly greater reliance on the accuracy of the available data.

Finally, known inertia-based accelerometers typically sense only those inputs having force components applied along a sensing axis, with substantially reduced "cross-axis" sensitivity. Accordingly, great care must be exercised when installing such accelerometers within the vehicle so as to obtain the desired alignment of its sensing axis therein. Even when properly aligned, however, significant cross-axis impacts still may not produce a sufficient output generate

SUMMARY OF THE INVENTION

It is an object of the present invention to provide a system and method for controlling actuation of a vehicle safety device, particularly in the context of side-impact crashes, which overcomes the above-described disadvantages of the prior art.

In accordance with the present invention, a system for controlling actuation of a safety device in a motor vehicle in response to an impact generating plastic deformation or "strain" in a first portion of the vehicle includes a ferromagnetic element which is mechanically coupled to (or, perhaps, even forms a portion of) the first portion of the vehicle deformed by the impact such that the ferromagnetic element is itself elastically and/or plastically deformed by strain waves resulting from the impact. As a result, the strain waves produce a change in the ferromagnetic properties of the ferromagnetic element in accordance with the inverse-magnetostrictive or "Villari" effect.

The system also includes a means for generating a first magnetic field, such as a first permanent magnet, mounted on the vehicle adjacent to the ferromagnetic element such that the ferromagnetic element falls within the first magnetic field. As a result, the first magnetic field generated by the first magnet is directly influenced by the ferromagnetic properties of the ferromagnetic element and, hence, the first magnetic field will vary upon propagation of the elastic strain waves through, or plastic deformation of, the ferromagnetic element. The system further includes a means for detecting variations in the first magnetic field, such as a first induction coil mounted on the vehicle adjacent to the ferromagnetic element and the first magnet, respectively. In this manner, the first induction coil may be used to detect variations in the first magnetic field caused by impact-generated strain of the ferromagnetic element.

Finally, the system includes a signal processor responsive to the field detecting means, e.g., responsive to the electromotive force voltage induced in the first induction coil for generating a trigger signal when the detected variation in the first magnetic field, as represented by the first electromotive force voltage, exceeds a first threshold; and an actuator responsive to the trigger signal for actuating the safety device upon receipt of the trigger signal.

In accordance with another feature of the present invention, the system preferably includes a second magnet mounted on the vehicle adjacent another portion of the ferromagnetic element so as to generate a second magnetic field which is likewise influenced by the elastic and/or plastic strain experienced by the ferromagnetic element as a result of the impact, along with a second induction coil mounted on the vehicle adjacent to both the ferromagnetic element and the second magnet so as to fall within the second magnetic field. As with the first magnetic field, the variation in the second magnetic field in response to a strain-generating impact induces a second electromotive force voltage in the second induction coil which, in turn, is fed to the signal processor for comparison with a second threshold.

If, as in a preferred embodiment of the present invention, the first and second magnets generate similar nominal magnetic fields, the second electromotive force voltage may be compared to the first electromotive, for example, to map the relative location of the point of impact on the vehicle. Moreover, where the second induction coil is also wound in a direction opposite that of the first induction coil, the first and second electromotive force voltages may be combined, for example, to cancel the effects of excessive EMI on the present system.

DETAILED DESCRIPTION OF THE PREFERRED EMBODIMENT(S)

Figure 1:
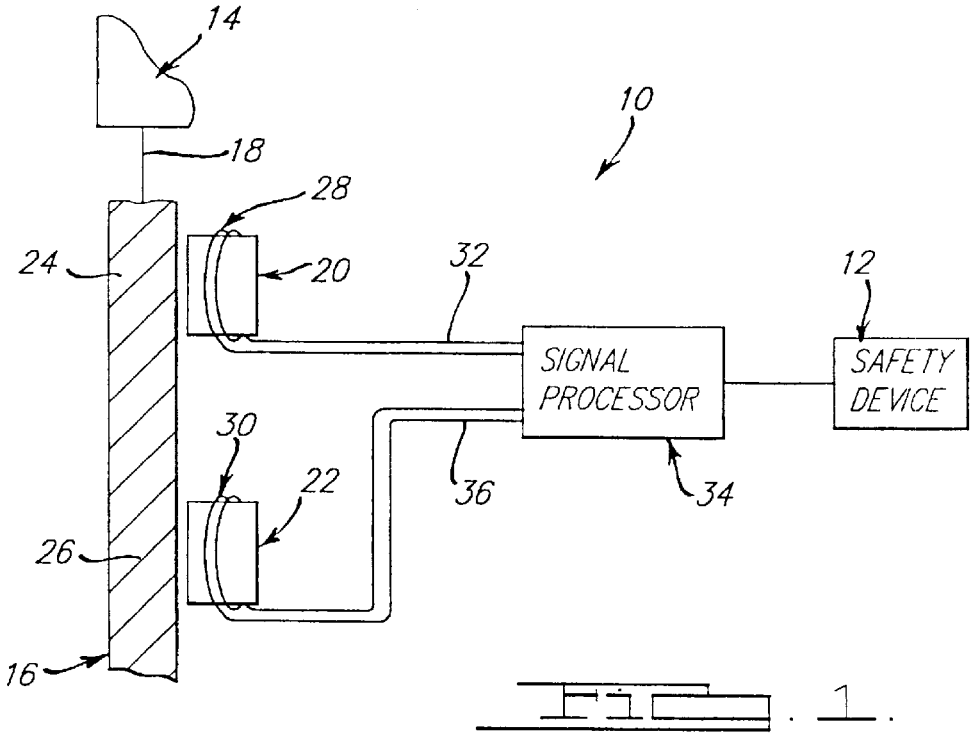
FIG. 1 is a schematic diagram of an exemplary system for controlling actuation of a vehicle safety device in accordance with the present invention.

Referring to the drawings, FIG. 1 contains a block diagram of a first exemplary system 10 in accordance with the present invention for controlling actuation of a vehicle safety device, such as a side air bag 12, in response to a side impact which generates plastic strain in a first portion of the vehicle, indicated generally at 14. The system 10 includes a ferromagnetic element 16 mechanically coupled over at least one mechanical transmission path 18 with the first portion 14 of the vehicle so as to receive elastic strain waves generated as a result of the plastic deformation of the first portion 14 of the vehicle. By way of example, the ferromagnetic element 16 may form an internal structural element, such as a cross-beam mounted within a door of the vehicle or the vehicle's "Bpillar." Alternatively, the ferromagnetic element 16 may itself preferably comprise a portion of the vehicle's "skin," i.e., an external body panel. Moreover, under the present invention, while the ferromagnetic element 16 is preferably formed of ferrous steel, a vehicle component may be rendered "ferromagnetic" for use with the present invention as by plating nonferromagnetic metals and nonmetals (composites or plastics) with a thin coat of ferromagnetic material such as nickel; or by bonding a ferromagnetic medium such as wire or ribbon on a surface of the component; or by embedding a ferromagnetic medium in the component during fabrication (as in the case of composites).

Referring again to FIG. 1, a pair of permanent magnets 20,22 are mounted on the vehicle adjacent to the ferromagnetic element 16 so that a portion 24,26 of the ferromagnetic element 16 falls within the magnetic field generated by each of the magnets 20,22. In this regard, it is noted that the magnets 20,22 may each be mounted in touching contact with the ferromagnetic element 16. Alternatively, one or the other of the magnets 20,22 may be mounted on the vehicle in such a manner as to leave a small gap between each magnet 20,22 and the ferromagnetic element 16.

A first induction coil 28 is mounted on the vehicle so as to fall within the magnetic field generated by the first magnet 20, while a second induction coil 30 is mounted on the vehicle so as to fall within the magnetic field generated by the second magnet 22. Upon plastic deformation of the first portion 14 of the vehicle, the ensuing elastic strain waves propagating along mechanical transmission path 18 elastically deform the ferromagnetic element 16 to vary its ferromagnetic properties which, in turn, alters each of the magnetic fields so as to induce an electromotive force voltage in each of the induction coils 28,30. Similarly, in accordance with another feature of the present invention, when the ferromagnetic element 16 itself forms a part of the first portion 14 of the vehicle which is plastically deformed by the impact, the ferromagnetic properties of the plastically-deformed ferromagnetic element 16 will likewise be altered upon impact, whereupon one or both of the magnetic fields will similarly be affected to induce electromotive force voltages in one or both of the induction coils 28,30. Of course, depending on the location of the magnets/coils and the nature and precise location of the impact, the electromotive force voltage induced in one of the induction coils 28,30 may reflect local plastic strain of the portion of the ferromagnetic element 16 falling within one of the magnetic fields while the other of the induction coils 28,30 reflects local elastic strain of the portion of the ferromagnetic element 16 falling within the other of the magnetic fields.

The first electromotive force voltage induced in the first induction coil 28 is communicated over a first signal path 32 to a signal processor 34. Similarly, the second electromotive force voltage induced in the second induction coil 30 is communicated over a second signal path 36 to the signal processor 34. The signal processor 34 contains signal amplification and crash-discrimination circuitry as necessary, for example, to amplify and perform analog-to-digital conversion of the electromotive force voltages supplied by the first and second induction coils 28,30 to obtain first and second digital signals representative of strain waves propagating through or generated in the ferromagnetic element 16.

In this regard, it is noted that, in contrast to the relatively low operating frequencies of prior art inertia-based piezoelectric accelerometers, the present invention contemplates a broad bandwidth and operating frequencies reaching well above 100 Khz. In this manner, the system 10 is provided with a large data set, even in response to relatively short-duration events such as side-impact crashes (noting further that elastic strain waves have been observed to propagate through ferrous steel elements at wave velocities of perhaps about 5 km/sec, which serves to underscore how quickly crash information may be communicated along the mechanical transmission path 18 to affect the ferromagnetic properties of the ferromagnetic element 16).

The signal processor's crash-discrimination circuitry thereafter processes the each digital signal using one or more algorithms to obtain one or more evaluative measures. When the evaluative measures, either alone or in combination, exceed certain predetermined thresholds, a crash event requiring actuation of the safety device will be deemed to have begun, and the signal processor 34 generates a trigger signal to actuate the air bag 12.

In accordance with another feature of the present invention, where the magnets/induction coils are placed relatively close to one anther on the vehicle so as to experience similar levels of EMI, the second induction coil 30 is preferably wound in a direction opposite the direction in which the first induction coil 28 is wound. Accordingly, the electromotive force voltage induced in the second induction coil 30 will be the inverse of the electromotive force voltage induced in the first induction coil 28. The two electromotive force voltages may be compared or combined in the signal processor 34 so as to reduce or eliminate the affects of EMI on the present system 10.

Additionally, under the present invention, the signal processor 34 preferably compares the relative electromotive force voltages induced in the first and second induction coils 28,30 to map the relative location of the impact on the vehicle. In this manner, system response may be further tailored so as to maximize operation of the safety device in response to a given impact.

Figure 2:
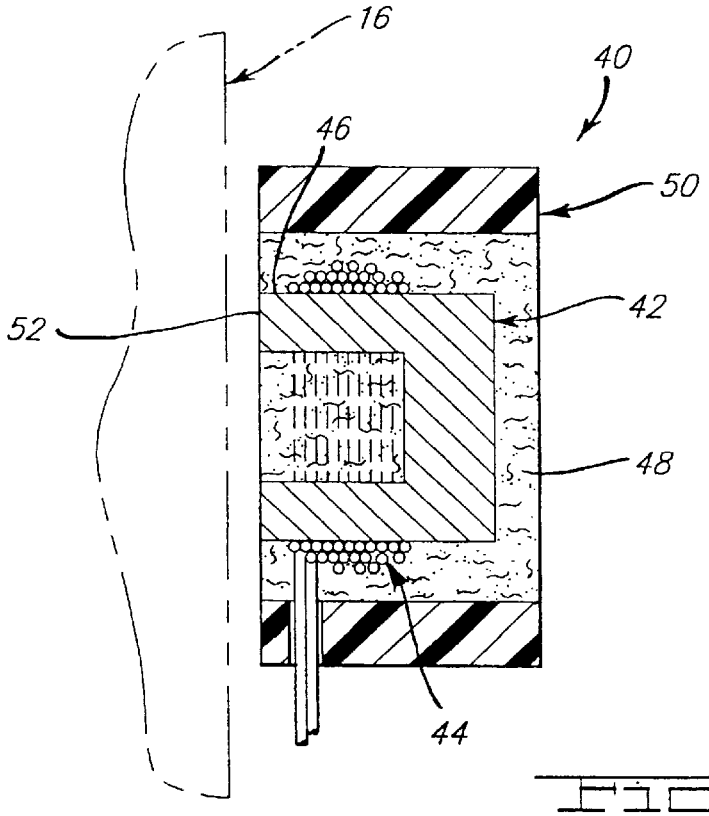
FIG. 2 is an elevational view in cross-section of an exemplary Villari-effect "sensor" in accordance with the present invention comprising a ferromagnetic element, a U-shaped magnet positioned adjacent to the ferromagnetic element, and an induction coil wound around the legs of the magnet.

Referring to FIG. 2, an exemplary constructed embodiment 40 of a Vilari-effect "sensor" in accordance with the present invention is shown in cross-section as a U-shaped permanent magnet 42 formed of a suitable magnetic material such as "Alnico-5"; and an induction coil 44 comprised, for example, of 24-gauge wire wound around the legs 46 of the magnet 42. The magnet 42 and the encompassing coil 44 are themselves potted as with a suitable nonmagnetic epoxy 48 within an encompassing nonmagnetic, protective shell or case 50 formed, for example, of a phenolic. The case 50 may thereafter be mounted to the vehicle as by affixing the sensor 40 directly to the ferromagnetic element 16 with a suitable adhesive such that the operative surface 52 of the sensor 40 is placed in opposition with the ferromagnetic element 16. As noted above, a gap may be provided between the operative surface 52 of the sensor 40 and the ferromagnetic element 16 since the magnetic interaction between the magnet 42 and the ferromagnetic element 16 does not require touching contact therebetween. The limits on allowable gap are determined, along with selection of magnet and coil selection and configuration, as a function of desired sensitivity in a manner known to those skilled in the art. Indeed, it is believed that sufficient sensitivity to crash events may thus be achieved so as to eliminate the need for amplification of the induced electromotive force voltage within the system's signal processor 34. And, since crash events will generate elastic and/or plastic strain several orders of magnitude greater than the transitory elastic strain waves generated as by rough road, door slams, loud proximate noises, and engine knock, to name just a few, the sensor 40 will itself serve to filter out such inputs.

In accordance with another feature of the present invention, the orientation of the sensor 40 illustrated in FIG. 2 relative to the axis of the vehicle is believed to be irrelevant, thereby obviating the installation difficulties so prevalent with prior art inertia-based accelerometers. Moreover, in contrast with known systems and methods relying on such inertia-based accelerometers, the Villari-effect sensor 40 used in the system 10 of the present invention generates an output only upon detecting variation in the magnetic field, while its output is relatively unaffected by temperature changes within the normal operating temperatures of a motor vehicle. In this manner, the system 10 of the present invention effectively eliminates the need for periodic recalibration so characteristic of inertia-based piezoelectric accelerometers. However, the present invention contemplates functionality testing of the sensor 40 as by injecting an appropriate mechanical signal (as through use of a magnetostrictive transmitter or other suitable source for the mechanical signal), or by incorporating means (not shown) in the sensor 40 for altering the magnetic field of the sensor's magnet 42 to effectively simulate strain in the ferromagnetic element 16.

While the preferred embodiment of the invention has been disclosed, it should be appreciated that the invention is susceptible of modification without departing from the spirit of the invention or the scope of the subjoined claims. For example, while the preferred embodiment utilizes the second magnet 22 and second coil 30 to counter the effects of EMI while further providing delay information with which to map the location at which the plastic strain has occurred, the present invention contemplates placement of the second, oppositely-wound coil 30 within the magnetic field of the first magnet 20 thereby to provide information with which to counter the effects of EMI.

I claim:

1. A system for controlling actuation of a safety device in a motor vehicle in response to an impact to the vehicle generating plastic strain in a first portion of the vehicle, said system comprising:

a ferromagnetic element mechanically coupled to the first portion of the vehicle such that said ferromagnetic element is deformed by elastic strain waves propagating away from the first portion of the vehicle as a result of the impact, whereby the ferromagnetic properties of said ferromagnetic element are altered by the strain waves;

a first means mounted on the vehicle adjacent to said ferromagnetic element for generating a first magnetic field, said first magnetic field being influenced by the ferromagnetic properties of said ferromagnetic element;

a first detecting means mounted on the vehicle adjacent to said ferromagnetic element and said first magnetic field generating means, respectively, for detecting variations in said first magnetic field;

a signal processor responsive to the first detecting means for generating a trigger signal when the detected variation in said first magnetic field exceeds a first threshold; and an actuator responsive to the trigger signal for actuating said safety device upon receipt of the trigger signal.

2. The system of claim 1, wherein said first magnetic signal generating means includes a permanent magnet.

3. The system of claim 1, wherein said ferromagnetic element extends into the first portion of the vehicle, whereby said ferromagnetic element is plastically strained by the impact.

4. The system of claim 1, wherein said first means for detecting variations in said first magnetic field includes a first induction coil mounted on the vehicle adjacent to said ferromagnetic element and said first magnetic field generating means, respectively, such that said first coil falls within said first magnetic field, and variations in said first magnetic field induce a first electromotive force voltage in said first coil.

5. The system of claim 4, wherein said first means for detecting variations in said first magnetic field includes an amplifier for amplifying the first electromotive force voltage induced in said first coil.

6. The system of claim 1, further including:

a second means mounted on the vehicle adjacent to said ferromagnetic element for generating a second magnetic field, said second magnetic field being influenced by the ferromagnetic properties of said ferromagnetic element; and a second means mounted on the vehicle adjacent to said ferromagnetic element and said second magnetic field generating means, respectively, for detecting variations in said second magnetic field, and wherein said signal processor is further responsive to the second means for detecting variations in said second magnetic field, said signal processor generating the trigger signal only when the detected variation in said first magnetic field exceeds the first threshold and the detected variation in said second magnetic field exceeds a second threshold.

7. The system of claim 6, wherein said second means for detecting variations in said second magnetic field includes a second induction coil mounted on the vehicle adjacent to said ferromagnetic element and said second magnet, respectively, such that said second coil falls within said second magnetic field, and variations in said second magnetic field induce a second electromotive force voltage in said second coil.

8. A method for controlling actuation of a safety device in a motor vehicle in response to an impact, wherein the impact generates plastic strain in a first portion of the vehicle and elastic strain waves propagating away from the first portion of the vehicle along a mechanical transmission path containing a ferromagnetic element, said method comprising the steps of:

generating a magnetic field adjacent to the ferromagnetic element such that a portion of the ferromagnetic element falls within said magnetic field, the ferromagnetic element influencing said magnetic field so as to vary said magnetic field upon propagation of the elastic strain waves through the ferromagnetic element;

detecting variations in said magnetic field;

comparing detected variations in said magnetic field with a first threshold; and actuating the safety device when the detected variation in said magnetic field exceeds the first threshold.

9. The method of claim 8, wherein the step of detecting variations in said magnetic field includes the steps of positioning an induction coil on the vehicle within said magnetic field; and inducing an electromotive force voltage in said coil with said magnetic field.

10. A method for controlling actuation of a safety device in a motor vehicle in response to an impact, wherein the impact plastically deforms a ferromagnetic element defining a first portion of the vehicle, said method comprising the steps of:

generating a magnetic field adjacent to the ferromagnetic element such that the ferromagnetic element falls within said magnetic field, the ferromagnetic element influencing said magnetic field so as to proportionately vary said magnetic field upon plastic deformation of the ferromagnetic element;

detecting variations in said magnetic field;

comparing detected variations in said magnetic field with a first threshold; and actuating the safety device when the detected variation in said magnetic field exceeds the first threshold.

11. The method of claim 10, wherein the step of detecting variations in said magnetic field includes the steps of positioning an induction coil on the vehicle within said magnetic field; and inducing an electromotive force voltage in said coil with said magnetic field.

*12. A system for controlling actuation of a safety device in a motor vehicle in response to an impact to the vehicle, said system comprising:*

*a ferromagnetic element coupled to a first portion of the vehicle such that said ferromagnetic element is deformed as a result of the impact;*

*first magnetic field generating means operatively mounted to the vehicle for generating a first magnetic field, said first magnetic field being influenced by said ferromagnetic element;*

*first detecting means mounted in close proximity to said ferromagnetic element and said first magnetic field generating means, respectively, for detecting variations in said first magnetic field.*

*13. The system as defined in claim 12 comprising:*

*a signal processor responsive to the first detecting means for generating a trigger signal when the detected variation in said first magnetic field exceeds a first threshold.*

*14. The system as defined in claim 13 further comprising:*

*an actuator responsive to the trigger signal for actuating said safety device upon receipt of the trigger signal.*

*15. The system as defined in claim 1 wherein the ferromagnetic element is mechanically coupled to the first portion of the vehicle.*

*16. A method for controlling actuation of a safety device in a motor vehicle in response to an impact, wherein the impact deforms a first portion of the vehicle, such deformation being reacted with a ferromagnetic element, said method comprising the steps of:*

*generating a magnetic field adjacent to the ferromagnetic element such that a portion of the ferromagnetic element falls within said magnetic field, the ferromagnetic field element influencing said magnetic field so as to vary said magnetic field upon deformation of the ferromagnetic element;*

*detecting variations in said magnetic field;*

*comparing detected variations in said magnetic field with a first threshold.*

*17. The method as defined in claim 16 including the step of actuating the safety device when the detected variation in said magnetic field exceeds the first threshold.*

*18. A system for controlling actuation of a safety device in a motor vehicle in response to an impact to the vehicle, said system comprising:*

*a ferromagnetic element coupled to a first portion of the vehicle;*

*first magnetic field generating means for generating a first magnetic field, said first magnetic field being influenced by the presence of said ferromagnetic element;*

*wherein the relative position between at least a portion of the ferromagnetic element and a portion of the first magnetic field is changed as a result of such impact;*

*first detecting means, mounted in close proximity to said first magnetic field generating means, for detecting variations in said first magnetic field.*

*19. The system as defined in claim 13 further comprising:*

*an actuator responsive to the trigger signal for actuating said safety device upon variation of the first magnetic field.*

* * * * *